United States Patent [19]

Suzuki et al.

[11] 4,267,511
[45] May 12, 1981

[54] SURFACE POTENTIOMETER

[75] Inventors: Koji Suzuki, Yokohama; Takehiko Shibata, Kokubunji, both of Japan

[73] Assignee: Canon Kabushiki Kaisha, Tokyo, Japan

[21] Appl. No.: 956,331

[22] Filed: Oct. 31, 1978

[30] Foreign Application Priority Data

Nov. 9, 1977 [JP] Japan ............................. 52-133592
Nov. 9, 1977 [JP] Japan ............................. 52-133593

[51] Int. Cl.³ .......................................... G01R 29/12
[52] U.S. Cl. ................................................. 324/458
[58] Field of Search ............................. 324/457, 458

[56] References Cited

U.S. PATENT DOCUMENTS 2,820,947  1/1958  Gunn .................................. 324/458
3,344,344  9/1967  Wales, Jr. ........................... 324/458
3,667,036  5/1972  Seachman .......................... 324/457
3,729,675  4/1973  Vosteen .............................. 324/457

*Primary Examiner*—Michael J. Tokar
*Attorney, Agent, or Firm*—Fitzpatrick, Cella, Harper & Scinto

[57] ABSTRACT

A surface potentiometer having a measuring electrode disposed at a predetermined distance from a surface to be measured and in which the electric field between the measuring electrode and the surface to be measured is intermittently shielded by a rotatable chopper to thereby induce an AC signal in the measuring electrode and the AC signal is clamped at a timing corresponding to the position of the chopper relative to the electrode to thereby accurately measure the potential of the surface to be measured.

5 Claims, 20 Drawing Figures

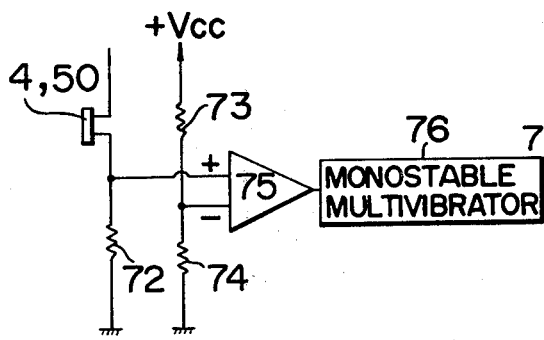
FIG. 9
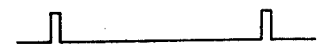
FIG. 10A
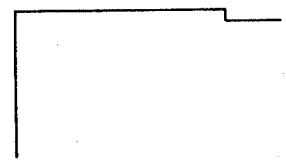
FIG. 10B
FIG. 10C
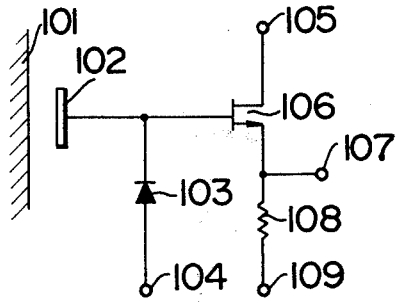
FIG. 11
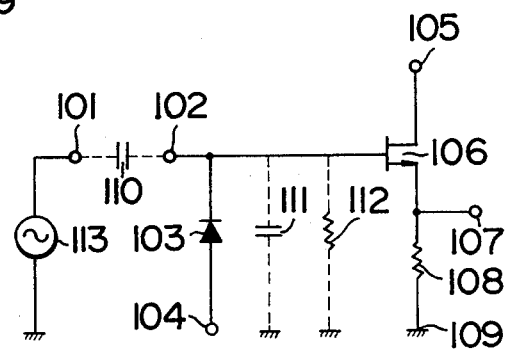
FIG. 12

SURFACE POTENTIOMETER

BACKGROUND OF THE INVENTION

1. Field of the Invention

This invention relates to a surface potentiometer for measuring the surface potential of a conductor or an insulator in a non-contact fashion.

2. Description of the Prior Art

As the simple measurement of a surface potential, there has hitherto been employed a method which comprises rotating a chopper blade biased to a predetermined potential between a surface to be measured and a measuring electrode and converting into AC signals the positive and negative potentials appearing at various timings on the surface to be measured, but the AC signal has made it impossible to distinguish between the positive and the negative polarities of the potential of the surface to be measured. Also, during the measurement of a surface potential, impedance conversion has been effected by utilizing the fact that the input impedance of a field effect transistor is great, but this has left the problem about how to bias the gate of the field effect transistor. As the bias means, it has generally been practised to connet the gate of a field effect transistor 106 to a specific potential within the operating range by a resistor 120, as shown in FIG. 18 of the accompanying drawings, but to take out the induced signal without attenuating the same by making the best use of the input impedance of $10^9$–$10^5$ ohms of the field transistor, a high resistance of the same degree as that is required and realization of such a resistor has led to a bulkiness and expensiveness of the device and has lacked in stability. Also, when the induced signal exceeds the break down voltage of the field effect transistor, it has been impossible to compensate for that.

SUMMARY OF THE INVENTION

It is an object of the present invention to provide a surface potentiometer for converting the potential of a surface to be measured into an AC signal and taking out the same and which can distinguish between the positive and the negative polarities of the potential of the surface to be measured.

It is a further object of the present invention which can stably convert a signal of very high impedance induced in the measuring electrode into a signal of low impedance and can take out the latter signal.

It is still a further object of the present invention to provide a surface potentiometer suited for the measurement of the latent image potential on a photosensitive medium in electrophotographic apparatus.

The invention will become more fully apparent from the following detailed description thereof taken in conjunction with the accompanying drawings.

BRIEF DESCRIPTION OF THE DRAWINGS

FIG. 9 shows the synchronizing signal generating circuit.

FIGS. 10A, 10B, and 10C illustrate the input versus output waveform of the sample and hold circuit.

FIG. 11 shows another embodiment of the surface potential measuring circuit.

FIG. 12 is an equivalent circuit diagram of FIG. 11.

DESCRIPTION OF THE PREFERRED EMBODIMENTS

Figure 1:
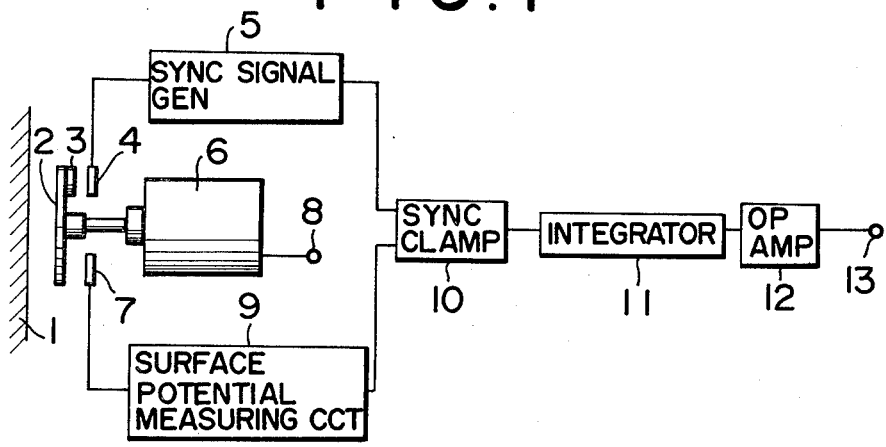
FIG. 1 is a schematic block diagram of the surface potentiometer of the present invention.

Referring to FIG. 1 which is a block diagram showing an embodiment of the present invention, it includes a surface to be measured 1, a measuring electrode 7 of as high an impedance as $10^9$–$10^{15}$ ohms, a chopper 2 given a predetermined bias voltage through a motor 6 and a terminal 8, a magnet 3 provided on the chopper 2, a Hall effect device 4 provided on the fixed side and which puts out a signal by being subjected to the field action from the magnet 3 each time the chopper 2 passes through the space between the surface to be measured 1 and the measuring electrode 7.

As the chopper 2 is rotatively driven from the motor 6, the electrostatic field based on the surface potential (S1 in FIG. 2) of the surface to be measured 1 intermittently acts on the measuring electrode 7 to induce an AC voltage in the measuring electrode 7. This induced voltage is converted into a signal of a low impedance by a surface potential measuring circuit 9 (FIG. 3) constituted by a field effect transistor 14 (hereinafter referred to as FET), a resistor 17 and a transistor 19 and is put out (S2 in FIG. 2).

On the other hand, the signal put out from the Hall device upon rotation of the chopper 2 operates a synchronizing signal generating circuit 5 (FIG. 9) and causes generation of a synchronizing signal (S3 in FIG. 2) opposite in polarity to said signal.

Figure 4:
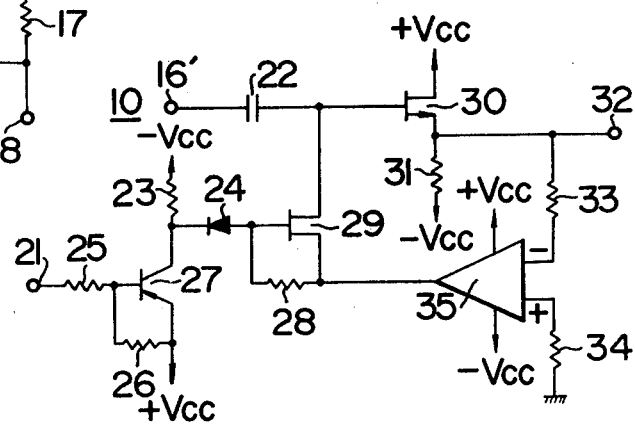
FIG. 4 shows the synchronizing clamp circuit.

The output S2 of the circuit 9 is applied to one input terminal 16' of a synchronizing clamp circuit 10 (FIG. 4) and the synchronizing signal S3 is applied to the other input terminal 21 of the circuit 10. In this case, the synchronizing signal S3 is obtained when the chopper 2 covers the measuring electrode 7 with a maximum area and so, when the surface potential of the surface to be measured 1 is of the positive polarity, as shown in FIG. 2, the signal S3 is applied in synchronism with the minimum point of the output S2 and when the surface potential of the surface to be measured 1 is of the negative polarity, the signal S3 is applied in synchronism with the maximum point of the output S2.

When the synchronizing signal is applied, a transistor 27 is made conductive and a diode 24 is rendered non-conductive, so that an FET 29 conducts with the gate-source thereof being zero potential. Therefore, the negative input side and the output side of a differential amplifier 35 become connected through FET 29, FET 30 and resistor 33 and all the feed back is exerted thereon. The input impedance and gain of the differential amplifier 35 are so great and the potential difference at the input side thereof is so small that an output terminal 32 is clamped to zero potential.

Figure 2:
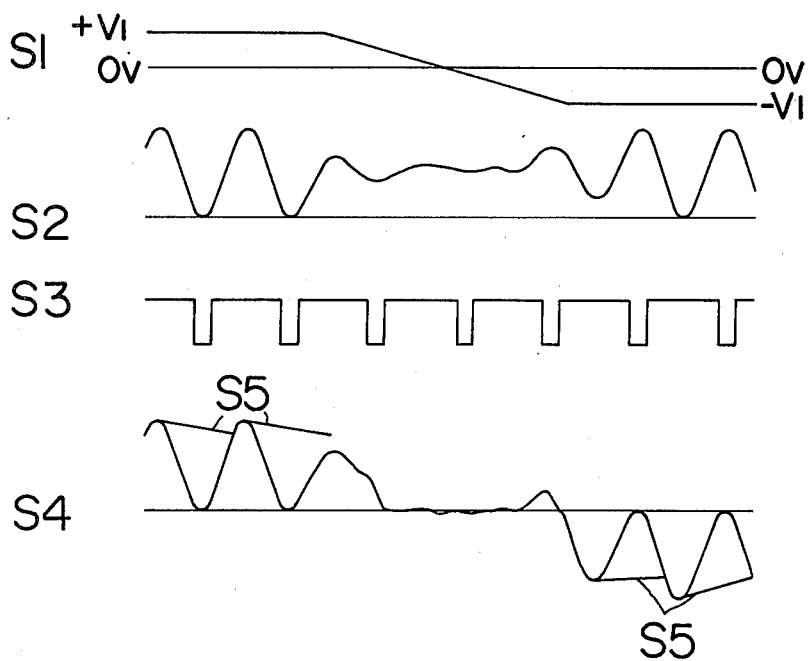
FIG. 2 illustrates the signal waveforms at various parts of the potentiometer shown in FIG. 1.
Figure 3:
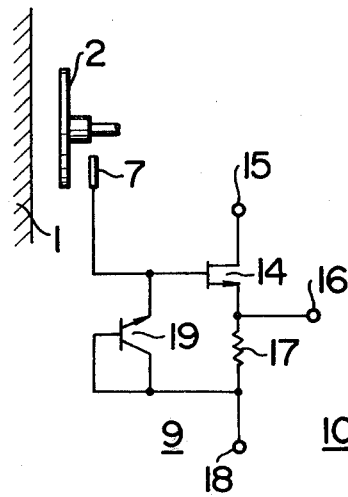
FIG. 3 shows the surface potential measuring circuit.

If the input impedance of the electronic circuit connected to the output terminal 32 and the interruption resistance of the FET 29 are sufficiently great, the charge stored in a capacitor 22 is not discharged when the synchronizing signal S3 has become exhausted and FET 29 has become non-conductive, so that the input signal S2 is shifted (only the DC level is varied with the amplitude of the signal constant) by an amount corresponding to the terminal voltage of the capacitor 22 and there is obtained on the output terminal 32 a DC reproduction as shown by S4 in FIG. 2 (the DC reproduction means conversion into a DC signal of a signal once converted into an AC signal (surface potential). In this case, FET 30 serves to draw out the junction between the capacitor 22 and the FET 29 to the terminal 32 at a low impedance.

Figure 5:
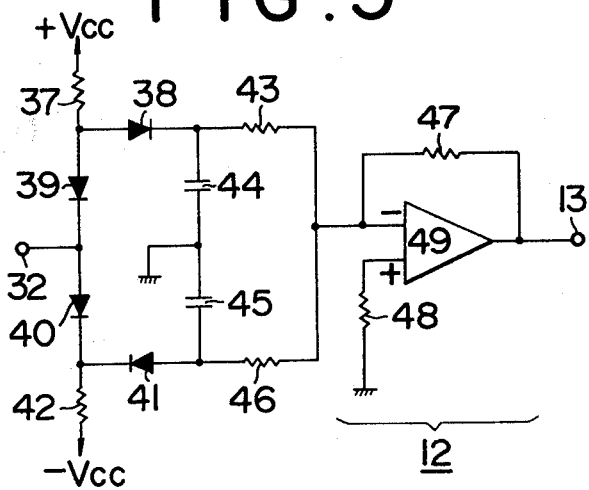
FIG. 5 is a schematic diagram of the integrating and operational circuit.

The positive or negative surface potential of the surface to be measured may be measured from the positive or negative of the so obtained DC reproduction output. In this case, to remove noise of high frequency component included in the DC reproduction output S4, the DC reproduction output S4 is applied as input to an integrating circuit 11 (FIG. 5) and the positive and the negative of the output S4 are rectified by diodes 38 and 41, respectively, and smoothed by capacitors 44 and 45, whereafter the sum thereof is taken at an operational amplifier 12 so that a smoothed DC output S5 of the DC reproduction output S4 may be provided at the output terminal 13. In FIG. 5, reference characters 39 and 40 designate diodes for correcting the forward voltages of diodes 38 and 41, and reference characters 43 and 46 designate rectifier resistors.

Figure 6:
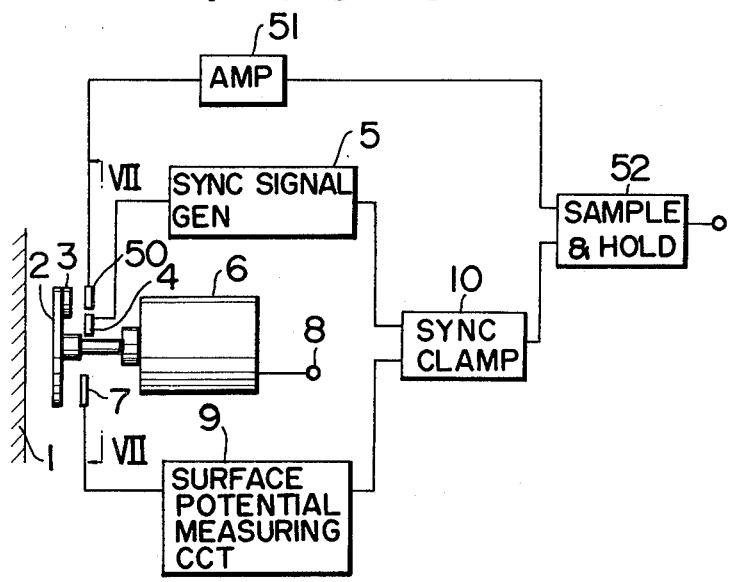
FIG. 6 is a schematic block diagram showing a modified form of the surface potentiometer according to the present invention.
Figure 7:
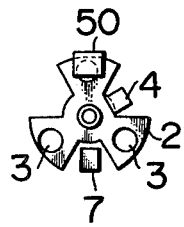
FIG. 7 is a sectional view taken along line VII—VII in FIG. 6.

FIG. 6 shows an arrangement in which for the measuring electrode 7 to detect the timing at which it faces the surface to be measured 1 without being interrupted by the chopper 2 as shown in FIG. 7, there is separately provided a Hall effect device 50 whose output is amplified by an amplifier 51, whereafter it is applied as a sampling pulse (FIG. 10B) to a sample and hold circuit 52 and converted into a DC signal (FIG. 10C) with the amplitude component of the DC reproduction output S4 of the synchronizing clamp circuit 10 being extracted and held, to thereby enable measurement of the momentary value of the surface potential which is sharply varied. When the surface potential is not sharply varied it is also possible that the DC signal after the measurement signal has been smoothed is applied to the sample hold circuit 52 to thereby hold the DC signal at a predetermined timing.

Figure 8:
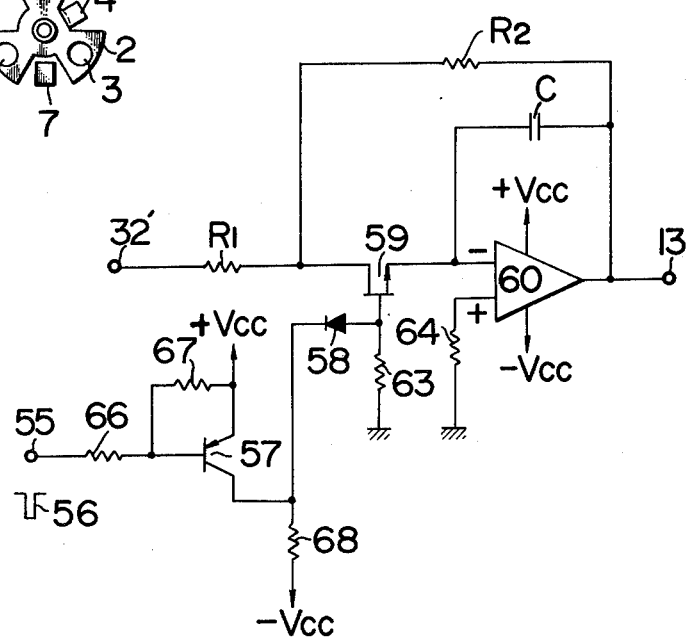
FIG. 8 shows the sample and hold circuit.

FIG. 8 shows an example of the sample and hold circuit 52. When a sampling pulse 56 of narrow width enters an input terminal 55 at a predetermined timing, a transistor 57 becomes conductive, a diode 58 becomes non-conductive and FET 59 becomes conductive. Upon the conduction of the FET 59, an inverted signal of a magnitude of R2/R1 of the DC reproduction output S4 applied to a terminal 32′ appears at the output terminal 13. At this time, the negative input of a differential amplifier 60 assumes zero potential to permit a capacitor C to be charged with a charge based on the output voltage. When the sampling pulse 56 becomes exhausted, the FET 59 is rendered non-conductive and since the input impedance of the differential amplifier 60 is very great, the charge stored in the capacitor is not discharged and the output voltages remains held.

FIG. 9 is a detailed circuit diagram of the previously described synchronizing signal generating circuit 5 and the previously described amplifier 51. After the output of the Hall element 4 or 50 has been amplified by a differential amplifier 75, a monostable multivibrator 76 puts out a pulse at the output terminal 77 thereof for a predetermined time. The output of the output terminal 77 is applied as input to the input terminal 21 or 55. In the present embodiment, a magnetic coupling comprising a magnet and a Hall device is used for the detection of the timing, whereas it is also possible, of course, to employ an optical coupling comprising a light emitting member such as light-emitting diode and a light receiving portion such as phototransistor or the like.

The potential measuring circuit will now be described in detail. FIG. 11 shows a circuit in which the gate of FET 10 is provided with a diode and FIG. 12 shows an equivalent circuit of FIG. 11.

Figure 17:
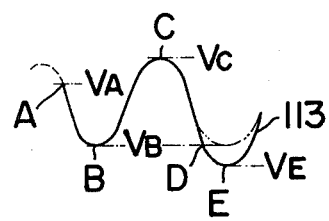
FIG. 17 illustrates the signal waveform of the surface to be measured.
Figure 18:
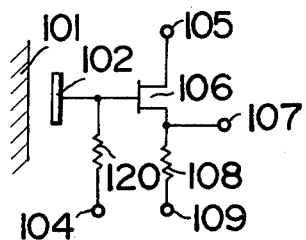
FIG. 18 is a circuit diagram of the potential measuring circuit according to the prior art.

A signal 113 (FIG. 17) of the surface to be measured 101 is applied to the gate of FET 106 and the cathode of a diode 103 through the space capacity 110 between the surface 101 and the measuring electrode 102, and is attenuated by a predetermined amount by a transmission impedance comprising the impedance of the space capacity 110 and a parallel impedance of the input capacity 111 and the input resistance 112 as the FET 106 and diode 103 are seen from the measuring electrode 102, and the signal appears at the gate of FET 106 and the cathode of the diode 103.

Even if the diode 103 is initially non-conductive (the cathode side of the diode is at higher potential than the anode side thereof), the diode side potential of the space capacity 110 is converged (approaches) toward a bias voltage $E_O$ applied to the terminal 104 through the interruption resistance of the diode 103. Assume that the output side of the space capacity 110 is already converged in the vicinity of $E_O$ at the point A of the input signal 113. From the point A to the point B, the output side of the space capacity 110 is directed toward a lower potential, but when it is about to become lower than $E_O$, the diode 103 conducts and the output potential becomes $E_O$ at the point B. (The forward voltage of the diode is neglected).

From the point B to the point C, the output side of the capacity 110 is directed toward a higher potential than $E_O$ and therefore, the diode 103 is rendered non-conductive and the charge stored in the capacity 110 maintains $$C(V_B - E_O),$$

so that a signal of the same waveform as the input signal 113 is provided at the output.

Even if the input signal 113 is directed toward a lower potential past the point C, the output side of the capacity 110 is higher than $E_O$ to the point D, so that the diode 103 is non-conductive and a signal of the same waveform as the signal 113 is provided at the output. Until the point E is reached past the point D, the output of the capacity 110 is about to become lower than $E_O$ and the diode 103 conducts, so that the output is held at $E_O$ and the capacity 110 is charged with a charge $$C(V_E - E_O).$$

When the point E is reached, the polarity of the input signal 113 is inverted and the diode 103 immediately becomes non-conductive, so that the potential at the point E rises to the potential at the point D, thus providing an output as indicated by a dotted line. As has been described above, the output side of the capacity 110 is held at the bias voltage $E_O$ at the negative peak point of the input signal. Therefore, a signal similar to the measured signal 113 is provided at the gate of FET 106, whereby a stable output of a low impedance may be provided at the source or the drain.

Figure 13:
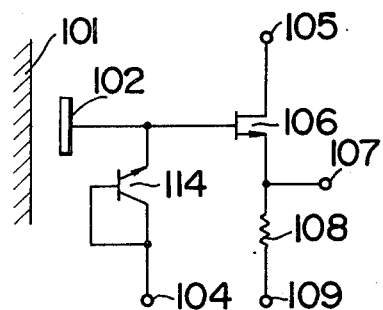
FIGS. 13 through 16 show further modified forms of the surface potential measuring circuit.

FIG. 13 shows an example which uses the PN junction between the base and emitter of a transistor 114 instead of the diode 103 in the above-described embodiment. The input resistor 112 in the equivalent circuit of the described embodiment is often affected by the resistance value of the diode 103 during the inverse bias thereof, but as the resistor 112 is smaller, the output signal becomes smaller. Also, the reverse current of the PN junction of the diode 103 is widely varied theoretically for temperature and so, it is remarkably affected by temperature.

However, depending on the types thereof, transistors can be manufactured in which the reverse current of the PN junction between the base and emitter is very much smaller than the reverse current of ordinary diodes, and thus it is possible to obtain an output which is less affected by temperature than when a diode is used. Also, the break down voltage between the base and emitter of a transistor is usually in the vicinity of 4 to 9 volts, so that the gate potential of FET 106 can be limited within the bias potential applied to the terminal 104 and the range of such break down voltage, thus serving as a protection for FET 106.

Figure 14:
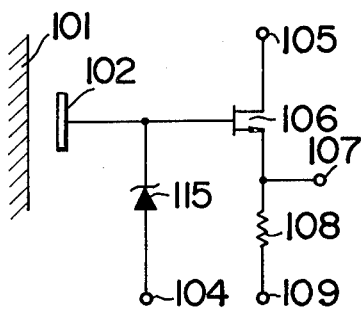

FIG. 14 shows an example which uses a Zener diode 115 in place of the diode 103 and the operation and effect thereof are similar to those of the FIG. 13 embodiment.

Figure 15:
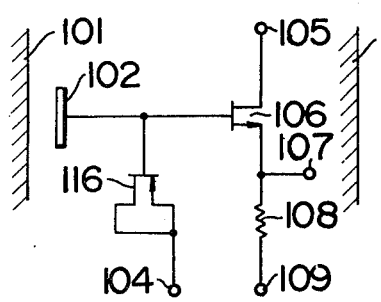

FIG. 15 shows an example which uses the PN junction of a junction type FET 116 instead of the diode 103. In this example, the input resistor 112 of the equivalent circuit may be further greater than that in the embodiment of FIGS. 13 and 14, thus providing a stable signal output.

Figure 16:
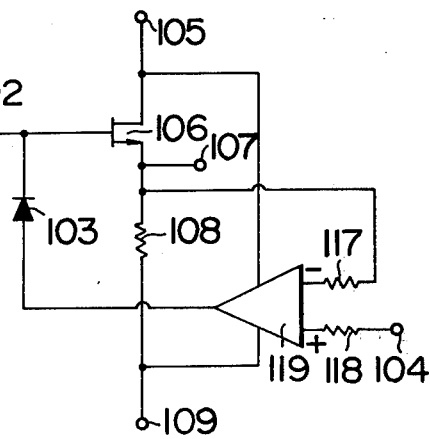

FIG. 16 shows an example in which the output of a differential amplifier 119 to whose negative input is applied the source potential of FET and to whose positive input is applied a predetermined potential within the gate operating range of FET is connected to that terminal of the diode 103 in the embodiment of FIG. 11 which is not connected to the measuring electrode 102, whereby the source potential of FET 106 is fed back to the diode 103. In this example, the diode 103 is rendered conductive during the negative peak of the measured signal 113 to form a closed loop which may be traced from the cathode of the diode 103 through the gate of FET 106, the source and the differential amplifier 119 to the anode of the diode 103, and the input impedance and gain are very great and all of them are fed back, whereby the output potential at the output terminal 107 becomes equal to the bias potential applied to the terminal 104. As the result, it is possible to compensate for variations with temperature in the forward voltage of the diode 103 and the voltage between the gate and source of FET 106 and thus, to provide a more stable signal output than in the previous embodiments.

The space impedance coupling between the measured surface 101 and the measuring electrode 102 is more approximate to a capacity coupling than to a resistor coupling and therefore, in the embodiments of FIGS. 11 and 13–16, the DC potential of the measured surface 101 or a signal potential of very low frequency cannot be measured. For this reason, as shown in FIG. 1, measurement is effected by rotating the chopper 2 and converting the DC signal or the low frequency signal into an AC signal.

The surface potentiometer of the present invention is advantageous for measuring a surface potential whose measurement range stretches over the opposite polarities, for example, for measuring the latent image potential on a photosensitive medium in an electrophotographic apparatus such as electrophotographic copying machine or the like.

The invention is not restricted to the illustrated embodiments, but various changes in design may be made within the scope of the invention as defined in the appended claims.

What we claim is:

1. A surface potentiometer for measuring the surface potential of a surface, comprising:
   a measuring electrode provided at a predetermined distance from the surface to be measured;
   chopper means for intermittently interrupting the space between the surface to be measured and said measuring electrode to convert into an AC signal the electrostatic field based on the surface potential of the surface to be measured and to cause said electrode to sense an AC signal;
   pulse generating means for sensing a relative position of said electrode with respect to said chopper means, without touching said electrode or chopper means, and for providing an output pulse synchronously with said sensing;
   a synchronizing clamp circuit operative in response to the synchronus pulses for clamping the AC signal induced in said measuring electrode; and
   an integrator circuit for integrating outputs from said clamp circuit to convert said outputs into a DC signal.

2. A surface potentiometer according to claim 1, wherein the potential of the AC signal induced in said measuring electrode when said chopper shields the electric field between said surface to be measured and said measuring electrode is clamped to zero potential by said synchronizing clamp circuit.

3. A surface potentiometer according to claim 1 or 2, wherein said pulse signal generating means comprises a magnetic coupling member.

4. A surface potentiometer comprising:
   a measuring electrode provided at a predetermined distance from a surface to be measured;
   chopper means for intermittently shielding the space between the surface to be measured and said measuring electrode to convert into an AC signal the electrostatic field based on the surface potential of the surface to be measured and to cause said electrode to sense an AC signal;
   pulse generating means for generating a timing pulse in accordance with the position of said chopper means relative to said electrode; and
   a hold circuit for DC-holding the AC signal induced in said electrode for periods corresponding to the periods between said timing pulses.

5. A surface potentiometer according to claim 4, wherein said hold circuit holds said AC signal when said chopper means does not shield the electric field between the surface to be measured and said measuring electrode.

* * * * *